United States Patent
Chen

Patent Number: 6,146,981
Date of Patent: Nov. 14, 2000

[54] METHOD OF MANUFACTURING BURIED CONTACT IN SRAM

[75] Inventor: Ming I. Chen, Tainan Hsien, Taiwan

[73] Assignee: United Microelectronics Corp., Hsinchu, Taiwan

[21] Appl. No.: 09/183,447

[22] Filed: Oct. 30, 1998

[51] Int. Cl.[7] ................................. H01L 21/425
[52] U.S. Cl. ................ 438/526; 438/523; 438/533; 438/586; 438/637; 438/700
[58] Field of Search .................... 438/233, 533, 438/526, 666, 637, 737, 738, 700, 523, 586

[56] References Cited

U.S. PATENT DOCUMENTS

| | | | |
|---|---|---|---|
| 5,550,085 | 8/1996 | Liu | 438/299 |
| 5,554,566 | 9/1996 | Lur et al. | 438/655 |
| 5,580,806 | 12/1996 | Chang et al. | 438/305 |
| 5,629,235 | 5/1997 | Liu | 438/533 |
| 5,792,683 | 8/1998 | Hayashi et al. | 438/238 |
| 5,923,998 | 7/1999 | Liu | 438/526 |
| 5,986,328 | 11/1999 | Liaw | 257/621 |
| 6,022,794 | 2/2000 | Hsu | 438/526 |
| 6,071,798 | 6/2000 | Yaung et al. | 438/526 |

*Primary Examiner*—Carl Whitehead, Jr.
*Assistant Examiner*—Jamie L. Davis
*Attorney, Agent, or Firm*—Hickman Coleman & Hughes, LLP

[57] ABSTRACT

A method of manufacturing a buried contact in an SRAM includes retaining a portion of the gate oxide layer adjacent to the source/drain region when a buried contact opening is formed. The retained gate oxide layer protects the substrate by acting as a buffer region, thus preventing the over-etching of substrate, which would form a deep trench. Consequently, contact resistance between the buried contact and the source/drain region is lowered, and leakage current at the junction is prevented.

17 Claims, 4 Drawing Sheets

METHOD OF MANUFACTURING BURIED CONTACT IN SRAM

BACKGROUND OF THE INVENTION

1. Field of the Invention

The present invention relates to a method of manufacturing static random access memory (SRAM). More particularly, the present invention relates to a method of manufacturing buried contact in SRAM.

2. Description of Related Art

SRAM is one of the fastest operating semiconductor memory devices. Therefore, SRAM has been widely used, for example, in the cache memory of a computer. At present, SRAMs are also used in microcomputers, microprocessors and other digital equipment.

In general, an SRAM integrated circuit can be divided into two regions, namely, a memory cell region and a peripheral circuit region. The memory cell region comprises a large number of memory cell units, each for storing a single bit of data. The peripheral circuit region includes some address decoders for decoding the memory addresses coming from the memory cell region and some memory operating circuits. FIG. 1 is a circuit diagram of a memory unit in the memory cell region of an SRAM.

As shown in FIG. 1, an SRAM cell comprises resistors $R_1$ and $R_2$ and MOS transistors $T_1$, $T_2$, $T_3$ and $T_4$. The resistor $R_1$ is connected in series with the MOS transistor $T_1$, while the drain and the source of the MOS transistor $T_1$ are connected to the voltage source $V_{DD}$ and ground $V_{SS}$, respectively. Similarly, the resistor $R_2$ is connected in series with the MOS transistor $T_2$, while the drain and the source of the MOS transistor $T_2$ are connected to the voltage source $V_{DD}$ and ground $V_{SS}$, respectively.

In addition, the gate of the MOS transistor $T_2$, the drain of MOS transistor $T_1$ and the drain of MOS transistor $T_3$ are connected at node point A. Similarly, the gate of the MOS transistor $T_1$, the drain of MOS transistor $T_2$ and the drain of MOS transistor $T_4$ are connected at node point B. The gates of the MOS transistors $T_3$ and $T_4$ are connected to a word line WL, while the sources of the MOS transistor $T_3$ and $T_4$ are connected to the bit line BL and the complementary bit line $\overline{BL}$, respectively. Transistors $T_1$ and $T_2$ act as drivers and transistors $T_3$ and $T_4$ act as a relays for accessing data. Lastly, the resistors $R_1$ and $R_2$ serve as loads.

In general, the contact of conventional SRAM is formed mostly above the source/drain regions. However, for integrated circuits having a high level of integration, the conventional method of forming contacts s becomes infeasible. Therefore, a type of contact known as a buried contact, which is especially suitable for forming local interconnects, is developed. A buried contact is capable of reducing wafer occupation. For example, when a buried contact is formed in an SRAM unit, as much as 25% of chip area can be saved. Hence, buried contact s are preferred in high-density semiconductor products.

FIGS. 2A through 2C are schematic, cross-sectional views showing the progression of steps in producing a buried contact in SRAM according to the conventional method.

First, as shown in FIG. 2A, a semiconductor substrate 10 is provided. Then, a device isolation structure, for example, a field oxide (FOX) layer 20 is formed above the substrate 10. Next, a gate oxide layer 30 is formed over the substrate 10, and then a first polysilicon layer 40 is deposited over the gate oxide layer 30. Thereafter, a photoresist layer 42 is coated over the first polysilicon layer 40, and then the photoresist layer 42 is patterned. In the subsequent step, the first polysilicon layer 40 and the gate oxide layer 30 are sequentially etched, thereby forming a buried contact opening 45.

Next, as shown in FIG. 2B, the photoresist layer 42 is removed. A second polysilicon layer 50 and a tungsten silicide layer 60 are sequentially formed over the first polysilicon layer 40 and the buried contact opening 45.

Next, as shown in FIG. 2C, conventional photolithographic technique is used to pattern out the source/drain region. Thereafter, the tungsten silicide layer 60 and the second polysilicon layer 50 are sequentially etched to form a conductive line 65 and a gate 75. Therefore, between the conductive line 65 and the gate 75, an opening 70 that exposes the surface of the source/drain region 90 is also formed. The opening 70 is purposely formed in a position slightly shifted towards the field oxide layer 20. Furthermore, since the second polysilicon layer 50 and the substrate 10 are made from the same material, a trench 80 as shown in FIG. 2C is also formed in the substrate 10. In addition, thickness of gate oxide layer 30d underneath the opening 70 is also reduced due to etching.

Thereafter, ions are implanted into the substrate at the bottom of the opening 70 using the tungsten silicide layer 60 as a mask, thereby forming doped regions (source/drain region) 90 and (buried contact) 100 in the substrate. Since the ions need not strike the substrate perpendicularly, and a trench 80 is formed in a previous etching operation, some ions will be trapped in the buried contact 100 on the left side at the bottom of the opening 70 aside from the source/drain region 90.

In the aforementioned method of forming an opening 70 to the source/drain region 90, a trench 80 is also formed. If the depth of this trench 80 is great, contact area between the buried contact 100 and the source/drain region 90 will be small. Hence, resistance at the junction will increase considerably. Moreover, if the depth of the trench 80 is too deep, there may be re-direction of current. Instead of passing through the implanted regions 90 and 100, the current flows by way of the substrate 10 and ground, thereby leading to junction leakage.

In light of the foregoing, there is a need a more efficient method of fabrication buried contact in SRAM.

SUMMARY OF THE INVENTION

Accordingly, the present invention provides a method of manufacturing the buried contact of an SRAM, which method can reduce the depth of a trench within the buried contact, and prevent junction leakage as well.

To achieve these and other advantages and in accordance with the purpose of the invention, as embodied and broadly described herein, the invention provides a method of manufacturing a buried contact in an SRAM. The method includes the steps of forming a gate oxide layer over a semiconductor substrate, and then forming a device isolation structure above the substrate. Thereafter, a first polysilicon layer is formed over the gate oxide layer. Then, photolithographic and etching operations are conducted to form a buried contact opening in the first polysilicon layer. Next, a portion of the gate oxide layer underneath the buried contact opening is etched retaining only a portion of the gate oxide layer adjacent to the desired source/drain region. The retained portion of the gate oxide layer serves as a protective layer for the substrate in subsequent etching operation.

Subsequently, a second polysilicon layer and a tungsten silicide layer are sequentially formed above the first polysilicon layer and the buried contact opening. Thereafter, photolithographic and etching operations are again conducted to form an opening in the tungsten silicon layer and the second polysilicon layer on one side of the buried contact opening. The opening is located between a gate stack layer and a conductive line layer. Since the retained gate oxide layer formed in a previous operation can act as a protective layer for the substrate, the etching selectivity ratio when the second and first polysilicon layers are etched is higher. Therefore, a shallower trench is formed in the substrate, thereby avoiding a high resistance at the junction between the buried contact and the source/drain region or any junction leakage current.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
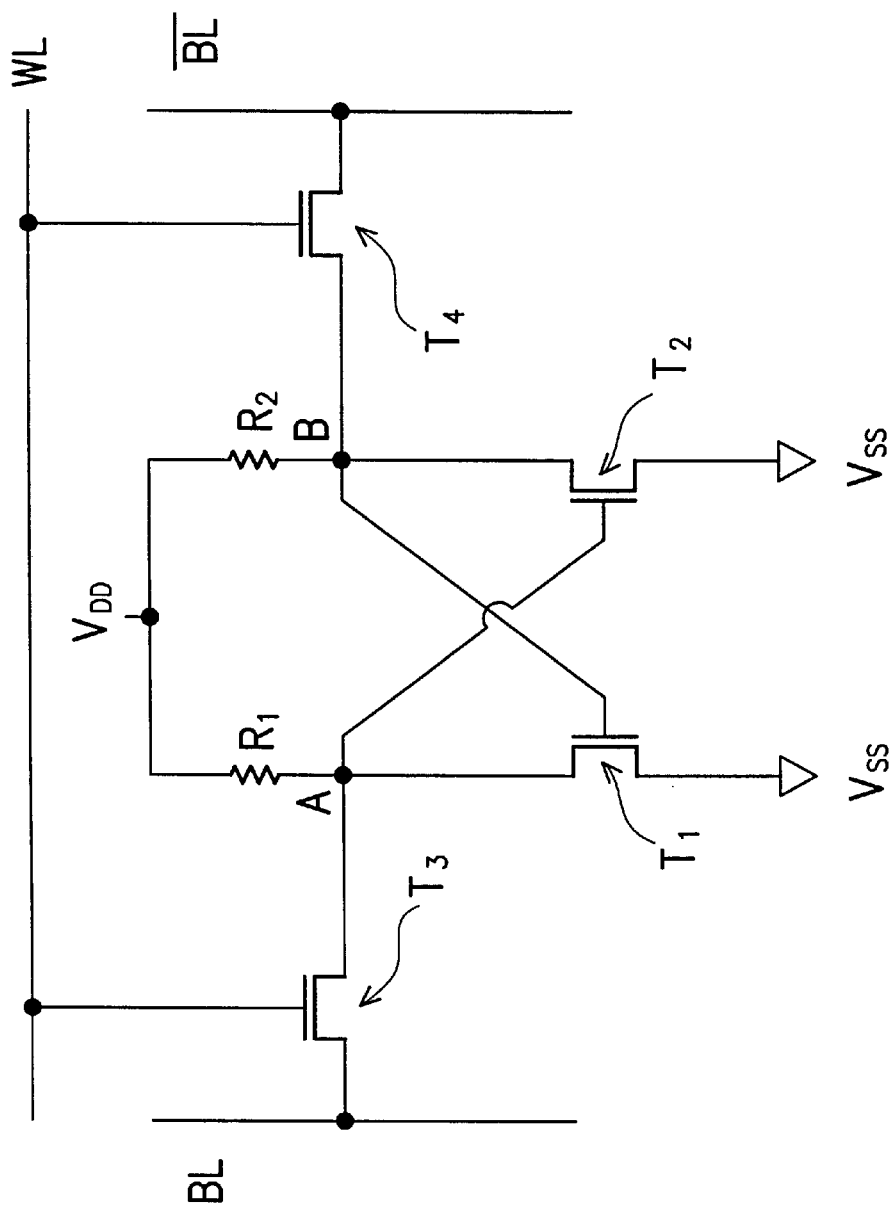
FIG. 1 is a circuit diagram of a memory unit in the memory cell region of SRAM.
Figure 2A:
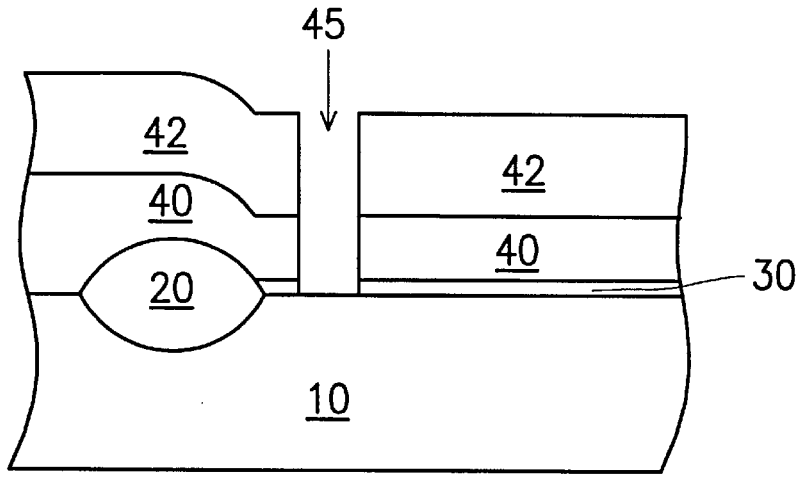
FIGS. 2A through 2C are schematic, cross-sectional views showing the progression of steps in producing a buried contact in SRAM according to the conventional method.
Figure 2B:
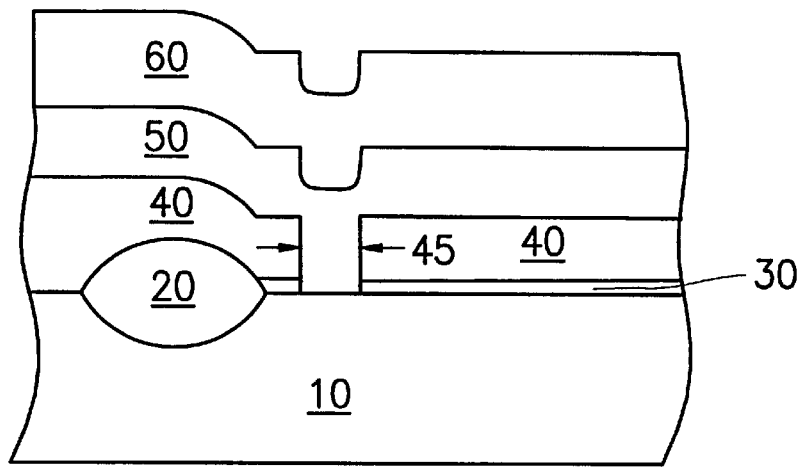
Figure 2C:
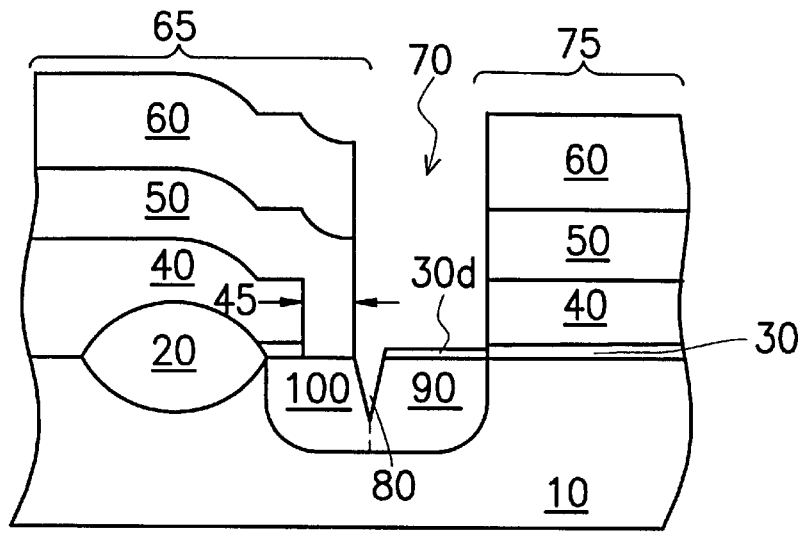

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3E are schematic, cross-sectional views showing the progression of steps in producing a buried contact in SRAM according to one preferred embodiment of this invention.

Figure 3A:
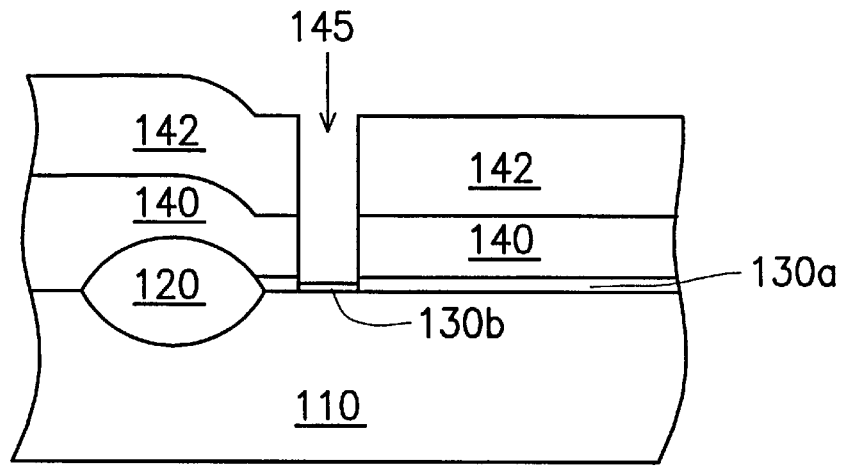
FIGS. 3A through 3E are schematic, cross-sectional views showing the progression of steps in producing a buried contact in SRAM according to one preferred embodiment of this invention.

First, as shown in FIG. 3A, a semiconductor substrate 110 is provided. Then, a device isolation structure, for example, a field oxide (FOX) layer 120 is formed above the substrate 110. Thereafter, gate oxide layers 130a/130b are formed over the substrate 110 using, for example, a thermal oxidation method. The gate oxide layers 130a/130b can be a silicon oxide layer having a thickness of about 100 Å to 250 Å. In the subsequent step, a first polysilicon layer 140 is formed over the gate oxide layers 130a/130b. For example, the first polysilicon layer 140 is deposited, for example, by heating to a temperature of between 575° C. to 650° C. using SiH$_4$ as the reactive gas in a low pressure chemical vapor deposition (LPCVD) process.

Thereafter, a positive photoresist layer 142 is deposited over the first polysilicon layer 140, and then the positive photoresist layer 142 is patterned. Subsequently, the conductive polysilicon layer 140 is etched to form a buried contact opening 145. Since the gate oxide layer 130b may be over-etched, the gate oxide layer 130b will be thinner than the gate oxide layer 130a. Here, only a portion of the gate oxide layer 130b is etched away because the retained gate oxide layer 130b can protect the substrate against subsequent etching operation when the opening to the source/drain region is formed. Consequently, the usual deep trench formed by a conventional method can be prevented. Finally, the photoresist layer 142 is removed.

Figure 3B:
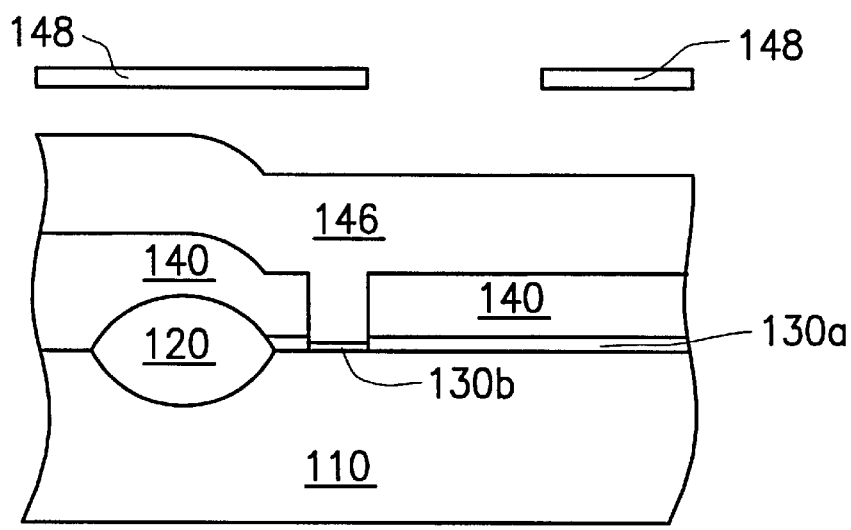
Figure 3C:
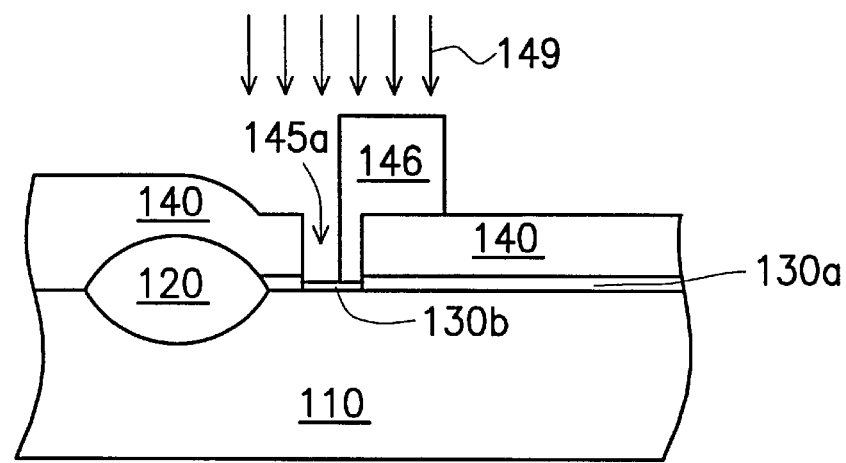

Next, as shown in FIG. 3B, a negative photoresist 146 is deposited over the first polysilicon layer 140. Then, the negative photoresist layer 146 is patterned using a photomask 148. After the negative photoresist layer 146 is developed, a photoresist layer that covers a portion of the exposed gate oxide layer 130b while retaining a portion of the buried contact opening 145a is formed. The ultimate configuration is shown in FIG. 3C. Next, the gate oxide layer 130b directly underneath a portion of the buried contact opening 145a is dry etched using plasma 149 until the substrate surface is exposed. Only a portion of the gate oxide layer in the buried contact opening 145a is etched away because a good electrical connectivity must be maintained between subsequently deposited conductive layer and the buried contact.

Figure 3D:
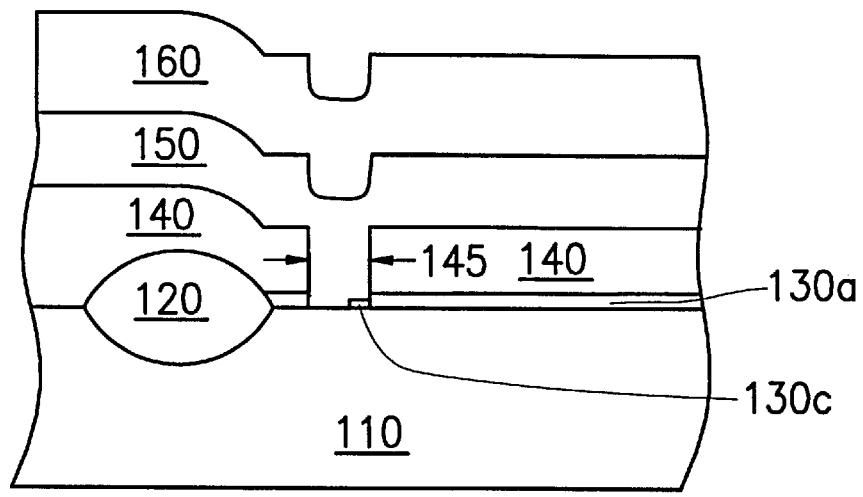

Next, as shown in FIG. 3D, the negative photoresist layer 146 is removed while retaining a portion of the gate oxide layer 130c. The gate oxide layer 130c serves as a protective layer for substrate 110 when an opening to the source/drain region is formed. Thereafter, a second polysilicon layer 150 and a tungsten silicide layer 160 are sequentially formed over the first polysilicon layer 140 and the buried contact opening 145. The tungsten silicide layer 160 is deposited over the second polysilicon layer 150 using WF$_6$ and SiH$_4$ as reactive gases at a temperature of between 300° C. to 400° C. in a LPCVD operation, for example.

Figure 3E:
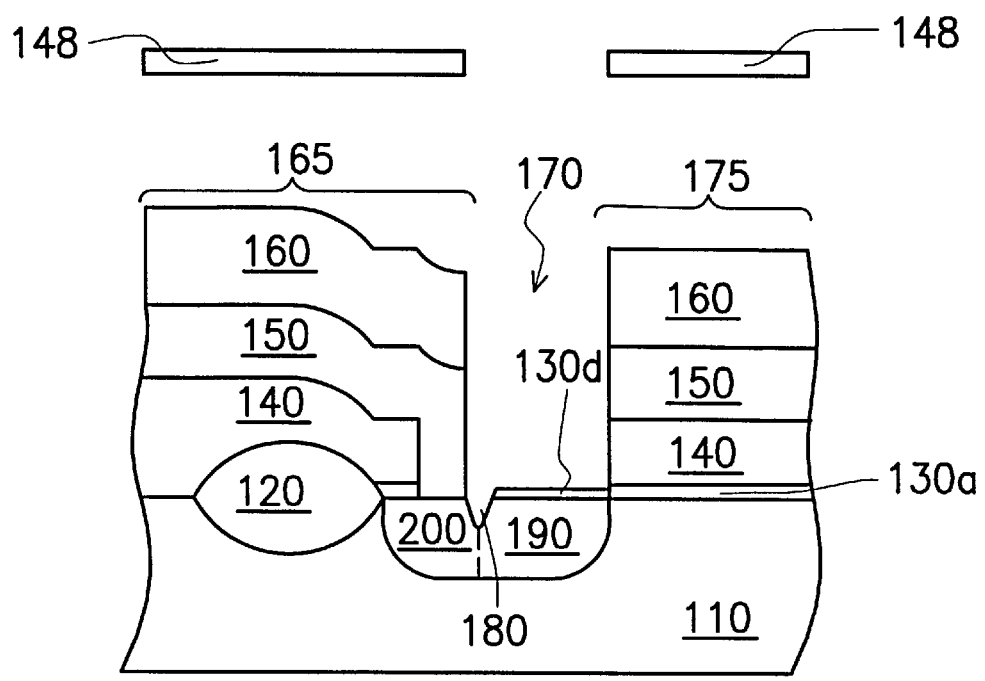

Next, as shown in FIG. 3E, photolithographic and etching operations are carried out, again using the photomask 148 but this time employing a positive photoresist. Consequently, a conductive line 165 and a gate 175 are formed within the tungsten silicide layer 160, the second polysilicon layer 150 and the first polysilicon layer 140. Moreover, an opening 170 that leads to a source/drain region as well as a trench 180 are formed between the conductive line 165 and the gate 175. Similarly, the gate oxide layer 130d directly underneath the opening 170 is thinner than the gate oxide layer 130a due to etching. However, due to the presence of a gate oxide layer 130c to protect the substrate 110, the etching selectivity ratio there is lowered and depth of the trench 180 after etching is much shallower than a conventional trench. In the subsequent step, ion implantation is carried out using the tungsten silicide layer 160 as a mask to form ion-doped regions including a source/drain region 190 and a buried contact 200 in the substrate 110.

In summary, the major aspect of this invention includes retaining a portion of the gate oxide layer when the buried contact opening is formed, thereby forming a protective oxide layer over the substrate. When various overlying layers are etched to form an opening that leads directly to the source/drain region, the gate oxide layer can serve as a buffer region preventing the formation of a deep trench.

Therefore, the invention is capable of reducing the depth of trench located in the buried contact region, and hence is able to reduce contact resistance between the buried contact and the source/drain region or any leakage current at the junction. Furthermore, the photomask for patterning the negative photoresist can be re-used to pattern the source/drain region. Hence, an additional photomask is not required.

It will be apparent to those skilled in the art that various modifications and variations can be made to the structure of the present invention without departing from the scope or spirit of the invention. In view of the foregoing, it is intended that the present invention cover modification and variations of this invention provided they fall within the scope of the following claims and their equivalents.

What is claimed is:

1. A method of manufacturing a buried contact of an SRAM, comprising the steps of:

providing a substrate, wherein the substrate has a device isolation structure;

forming an oxide layer and a first conductive layer over the substrate;

performing a first photolithographic and etching operation on the first conductive layer to form a first opening in the first conductive layer at a desired buried contact region such that the first opening exposes a portion of the oxide layer, wherein the portion of the oxide layer gets thinner due to over-etching effect in the first photolithographic and etching operation;

performing a second photolithographic and etching operation on the portion of the oxide layer in the first opening to form a second opening that exposes the substrate such that a reserving portion of the oxide layer in the first opening adjacent to a desired source/drain region is retained;

forming a second conductive layer such that the second conductive layer is electrically connected to the substrate through the second opening;

performing a third photolithographic and etching operation on the second conductive layer, the first conductive layer, the oxide layer, and the substrate to form a conductive line and a gate such that a third opening between the conductive line and the gate is also formed, wherein the third opening exposes a portion of the oxide layer over the desired source/drain region and exposes the substrate over a portion of the desired buried contact region, wherein the reserving portion of the oxide layer and a portion of the substrate thereunderneath are removed to form a trench in the substrate while the portion of the oxide layer over the desired source/drain region is over etched; and performing an ion implantation to implant ions into the substrate through the third opening and the trench to form a buried contact and a source/drain electrode region in the substrate at the desired buried contact region and the desired source/drain region.

2. The method of claim 1, wherein the step of forming the first conductive layer includes depositing polysilicon to form a polysilicon layer.

3. The method of claim 2, wherein the step of forming the polysilicon layer includes low pressure chemical vapor deposition step using $SiH_4$ as a gaseous reactant at a temperature of roughly between 575° C. to 650° C.

4. The method of claim 1, wherein the step of forming the second conductive layer includes forming a polysilicon layer and forming a tungsten silicide layer.

5. The method of claim 4, wherein the step of forming the polysilicon layer includes low pressure chemical vapor deposition step using $SiH_4$ as a gaseous reactant at a temperature of roughly between 575° C. to 650° C.

6. The method of claim 4, wherein the step of forming the tungsten silicide layer includes low pressure chemical vapor deposition using $WF_6$ and $SiH_4$ as gaseous reactants at a temperature of roughly between 300° C. to 400° C.

7. The method of claim 1, wherein the step of performing the second photolithographic and etching operation includes using negative photoresist.

8. The method of claim 7, wherein the step of performing the third photolithographic and etching operation includes using a positive photoresist, and the same photomask is used in both the second and the third photolithographic/etching operations.

9. A method of manufacturing a buried contact of an SRAM, comprising the steps of:

providing a substrate, wherein the substrate has a device isolation structure;

forming an oxide layer and a first conductive layer over the substrate;

performing a first photolithographic and etching operation on the first conductive layer to form a first opening in the first conductive layer at a desired buried contact region, wherein the first opening exposes a portion of the oxide layer, at which the portion of the oxide layer gets thinner due to over-etching effect in the first photolithographic and etching operation;

performing a second photolithographic and etching operation on the portion of the oxide layer in the first opening to form a second opening that exposes a portion of the substrate, wherein a reserving portion of the oxide layer in the first opening adjacent to a desired source/drain region is retained;

forming a second conductive layer such that the second conductive layer is electrically connected to the substrate through the second opening; and performing a third photolithographic and etching operation on the second conductive layer, the first conductive layer, the oxide layer, and the substrate to form a conductive line and a gate such that a third opening between the conductive line and the gate is also formed, wherein the third opening exposes a portion of the oxide layer over the desired source/drain region and exposes the substrate over a portion of the desired buried contact region, wherein the reserving portion of the oxide layer and a portion of the substrate thereunderneath are removed to form a trench in the substrate while the portion of the oxide layer over the desired source/drain region is over etched.

10. The method of claim 9, wherein the step of forming the first conductive layer includes depositing polysilicon to form a polysilicon layer.

11. The method of claim 10, wherein the step of forming the polysilicon layer includes low pressure chemical vapor deposition using $SiH_4$ as a gaseous reactant at a temperature of roughly between 575° C. to 650° C.

12. The method of claim 9, wherein the step of forming the second conductive layer includes forming a polysilicon layer and forming a tungsten silicide layer.

13. The method of claim 12, wherein the step of forming the polysilicon layer includes low pressure chemical vapor deposition using $SiH_4$ as a gaseous reactant at a temperature of roughly between 575° C. to 650° C.

14. The method of claim 12, wherein the step of forming the tungsten silicide layer includes low pressure chemical vapor deposition using $WF_6$ and $SiH_4$ as gaseous reactants at a temperature of roughly between 300° C. to 400° C.

15. The method of claim 9, wherein the step of performing the second photolithographic and etching operation includes using negative photoresist.

16. The method of claim 15, wherein the step of performing the third photolithographic and etching operation includes using positive photoresist, and the same photomask is used in both the second and the third photolithographic and etching operations.

17. The method of claim 9, wherein after the step of forming the third opening, further includes performing an ion implantation implanting ions into the substrate through the third opening to form a buried contact and a source/drain region.

* * * * *